US011864329B2

(12) United States Patent
Fu et al.

(10) Patent No.: US 11,864,329 B2
(45) Date of Patent: Jan. 2, 2024

(54) PACKAGING STRUCTURE WITH EMBEDDED ELECTRONIC COMPONENTS AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Chih-Chieh Fu, New Taipei (TW); Yuan-Yu Lin, New Taipei (TW); Ze-Jie Li, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 72 days.

(21) Appl. No.: 17/824,020

(22) Filed: May 25, 2022

(65) Prior Publication Data

US 2023/0345643 A1 Oct. 26, 2023

(30) Foreign Application Priority Data

Apr. 25, 2022 (CN) ......................... 202210440061.4

(51) Int. Cl.
*H05K 3/42* (2006.01)
*H05K 3/46* (2006.01)
(Continued)

(52) U.S. Cl.
CPC ............. *H05K 3/429* (2013.01); *H05K 1/116* (2013.01); *H05K 1/181* (2013.01); *H05K 1/183* (2013.01); *H05K 3/3494* (2013.01); *H05K 3/4644* (2013.01); *H01L 21/486* (2013.01); *H01L 21/4857* (2013.01); *H01L 23/49816* (2013.01);
(Continued)

(58) Field of Classification Search
CPC ...... H05K 1/183; H05K 1/181; H05K 3/4644; H05K 3/429
See application file for complete search history.

(56) References Cited

U.S. PATENT DOCUMENTS

2015/0062848 A1* 3/2015 Lee ......................... H01L 24/19 156/60
2016/0351543 A1* 12/2016 Ryu ...................... H01L 25/105
(Continued)

*Primary Examiner* — Sherman Ng
(74) *Attorney, Agent, or Firm* — ScienBiziP, P.C.

(57) ABSTRACT

A method for manufacturing a fan-out chip packaging structure with decreased use of a crack-inducing hot-soldering process includes a first carrier plate with first and a second outer wiring layers. Two first conductive posts are formed on the first outer wiring layer, one end of each post is electrically connected to the first outer wiring layer. A receiving groove is formed between first conductive posts, and a sidewall of each post is surrounded by a first insulating layer. An embedded component is laid in the receiving groove and a second carrier plate is formed on the first insulating layer, wherein the second carrier plate carries third and fourth outer wiring layers. A first outer component is connected to the second outer wiring layer, and a second outer component is connected to the fourth outer wiring layer.

13 Claims, 12 Drawing Sheets

(51) Int. Cl.
*H05K 1/18* (2006.01)
*H05K 1/11* (2006.01)
*H05K 3/34* (2006.01)
*H01L 23/00* (2006.01)
*H01L 23/498* (2006.01)
*H01L 21/48* (2006.01)

(52) U.S. Cl.
CPC .. *H01L 23/49822* (2013.01); *H01L 23/49833* (2013.01); *H01L 23/49838* (2013.01); *H01L 24/16* (2013.01); *H01L 24/81* (2013.01); *H01L 2224/16235* (2013.01); *H01L 2224/81815* (2013.01); *H01L 2924/1434* (2013.01); *H01L 2924/3512* (2013.01); *H05K 2201/10159* (2013.01); *H05K 2201/10734* (2013.01)

(56) References Cited

U.S. PATENT DOCUMENTS

2020/0015357 A1* 1/2020 Kim ......................... H01Q 1/22
2020/0161248 A1* 5/2020 Lee ......................... H01L 25/18
2020/0303314 A1* 9/2020 Kang .................. H01L 23/5386

* cited by examiner

PACKAGING STRUCTURE WITH EMBEDDED ELECTRONIC COMPONENTS AND METHOD FOR MANUFACTURING THE SAME

FIELD

The disclosure relates to field of circuit board manufacture, and more particularly, to a packaging structure and a method for manufacturing the packaging structure.

BACKGROUND

Chips can be attached in a fan-out packaging structure, but the fan-out package needs at least three reflow treatments, this may cause deformation of the circuit board in the packaging structure. Improvement in the art is desired.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Figure 1:
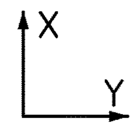
FIG. 1 is a cross-sectional view of a first carrier plate of a packaging structure according to an embodiment of the present disclosure.
Figure 1:
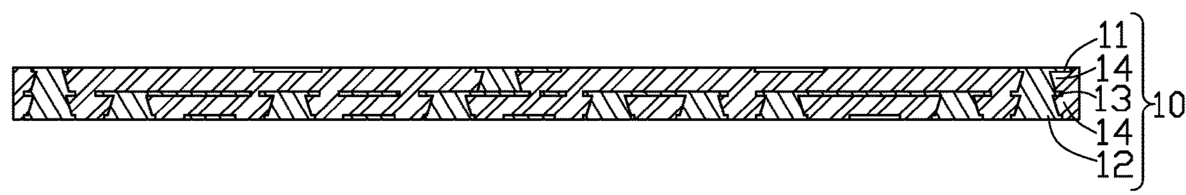

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 12:
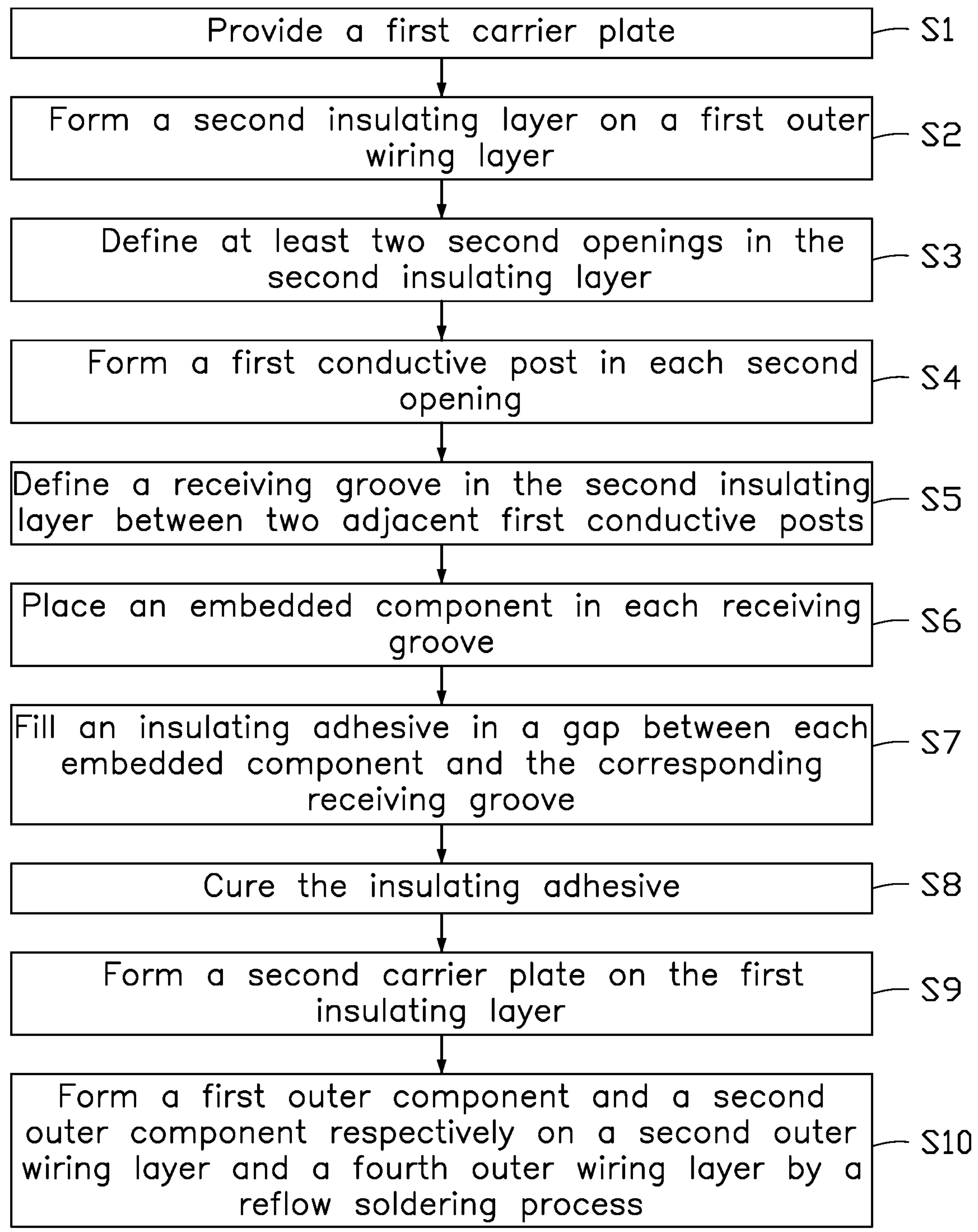
FIG. 12 is a flowchart of a method for manufacturing a packaging structure according to the present disclosure.

The present disclosure provides a method for manufacturing a circuit board. The method can be used to manufacture a double-sided circuit board and a multilayer circuit board. Referring to FIG. 12, the method for manufacturing a packaging structure is presented in accordance with an embodiment. The method is provided by way of example, as there are a variety of ways to carry out the method. The method can begin at S1.

At step S1, referring to FIG. 1, a first carrier plate 10 is provided. The first carrier plate 10 includes a first outer wiring layer 11 and a second outer wiring layer 12 stacked in a first direction X. The first outer wiring layer 11 and the second outer wiring layer 12 are electrically connected to each other.

In at least one embodiment, the first carrier plate 10 further includes at least one first intermediate wiring layer 13 located between the first outer wiring layer 11 and the second outer wiring layer 12. Each first intermediate wiring layer 13 is electrically connected to the first outer wiring layer 11 and the second outer wiring layer 12. The first carrier plate 10 can be manufactured from a metal cladding plate, which includes a second substrate layer 14 and two first metal foils (not shown) formed on two opposite surfaces of the second substrate layer 14. The two first metal foils are then etched by a development and exposure process to obtain the first intermediate wiring layer 13 and the second outer wiring layer 12. Then, another second substrate layer 14 and another first metal foil are formed on the first intermediate wiring layer 13. The first metal foil is then etched to form the first outer wiring layer 11.

Figure 2:
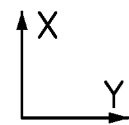
FIG. 2 is a cross-sectional view showing a second insulating layer formed on the first carrier plate of FIG. 1.
Figure 2:
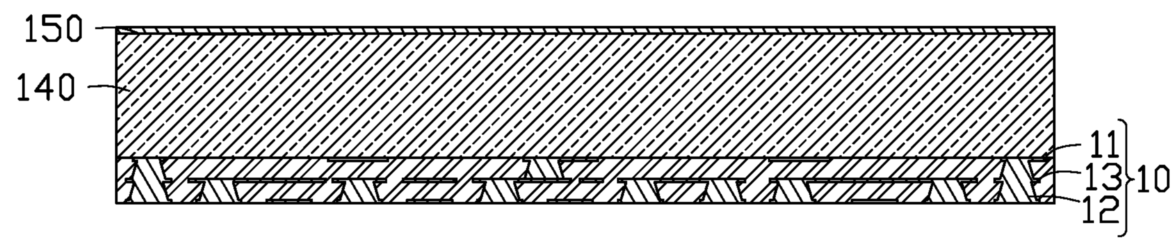

At step S2, referring to FIG. 2, a second insulating layer 140 is formed on the first outer wiring layer 11.

In at least one embodiment, a second insulating layer 140 is also formed on the second insulating layer 140. The second insulating layer 140 is sandwiched between the conductive layer 150 and the first outer wiring layer 11.

The second insulating layer 140 includes, but is not limited to, polypropylene (PP).

Figure 3:
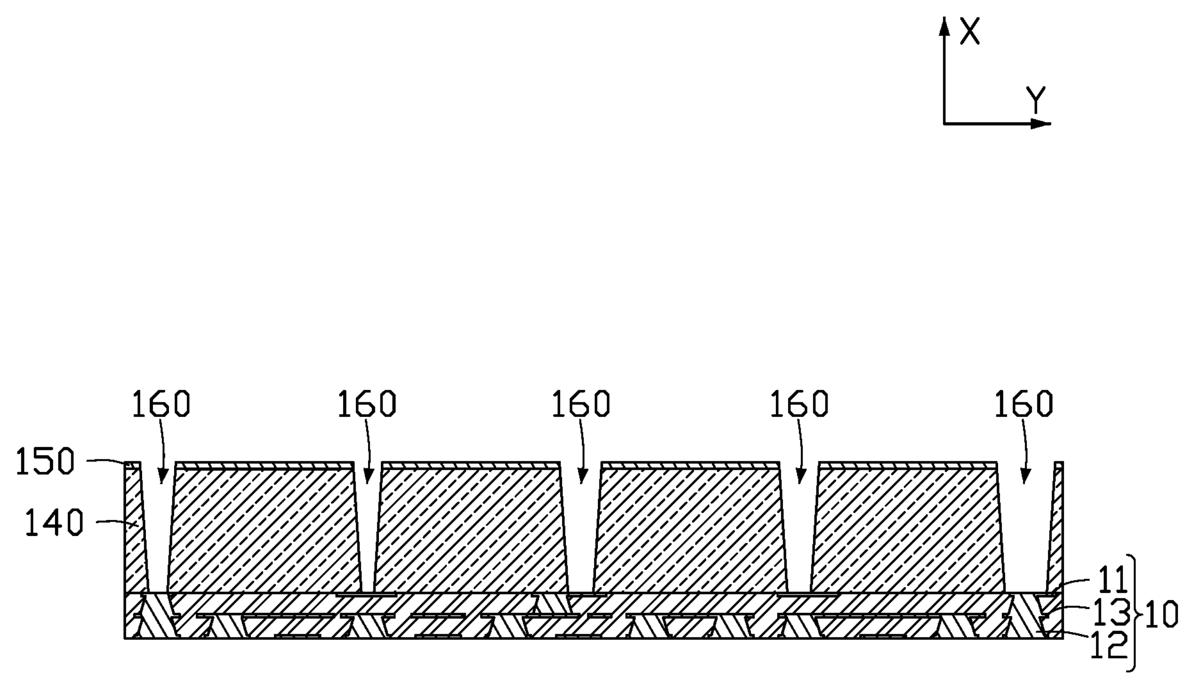
FIG. 3 is a cross-sectional view showing a second opening defined in the second insulating layer of FIG. 2.

At step S3, referring to FIG. 3, at least two second openings 160 are defined in the second insulating layer 140. The second openings 160 may also be defined in the conductive layer 150. Each second opening 160 extends along the first direction X, and a portion of the first outer wiring layer 11 is exposed from the second openings 160.

In at least one embodiment, the second openings 160 are formed by laser cutting, which can improve an accuracy of size of the second openings 160. In another embodiment, the second openings 160 may be formed by mechanical drilling.

Figure 4:
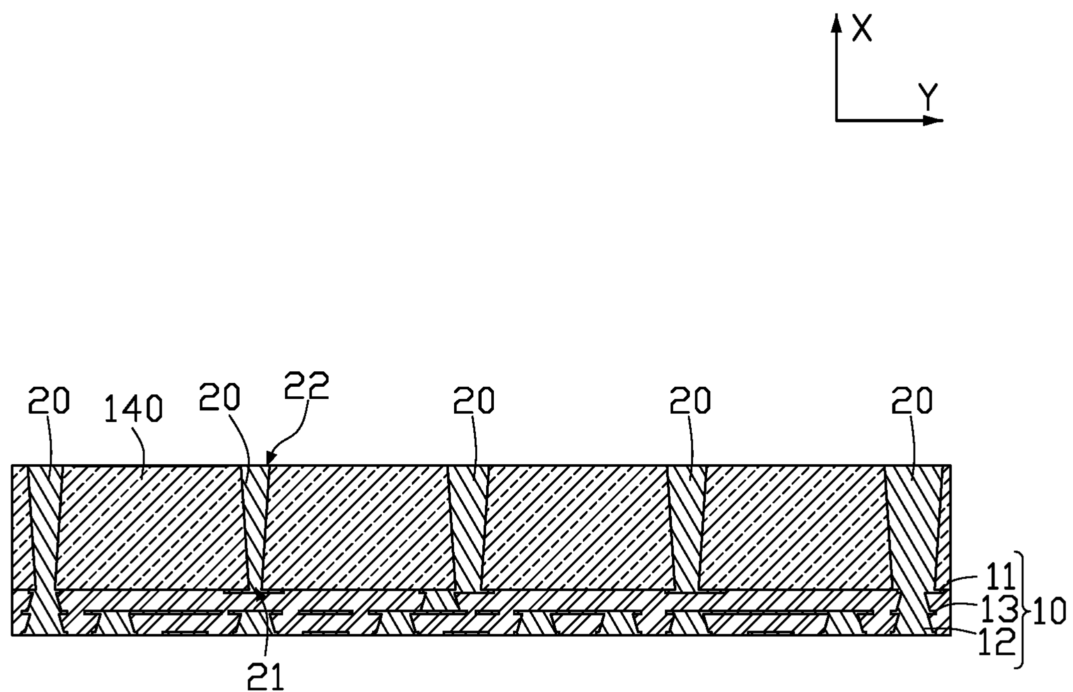
FIG. 4 is a cross-sectional view showing a first conductive post formed in the second opening of FIG. 3.

At step S4, referring to FIG. 4, a first conductive post 20 is formed in each second opening 160. That is, at least two first conductive posts 20 are formed. The at least two first conductive posts 20 are arranged along a second direction Y perpendicular to the first direction X.

Figure 5:
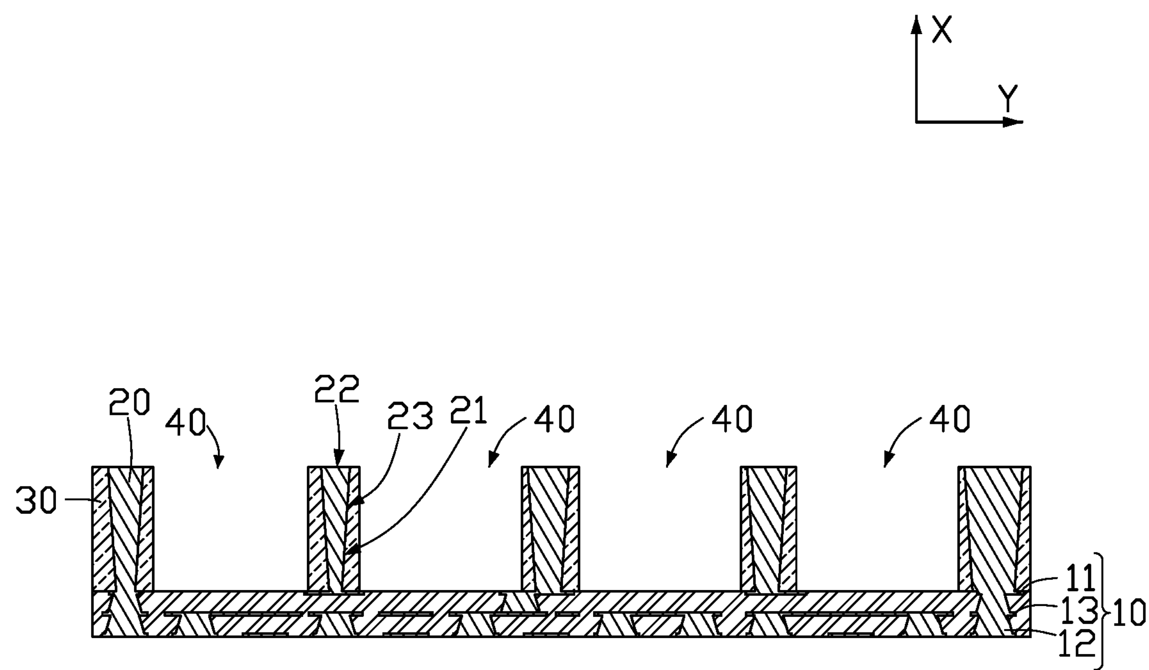
FIG. 5 is a cross-sectional view showing a receiving groove formed in the second insulating layer of FIG. 4.

At step S5, referring to FIG. 5, a receiving groove 40 is defined in the second insulating layer 140 between adjacent first conductive posts 20. Each first conductive post 20 includes a first end 21, a second end 22 opposite to the first end 21, and a sidewall 23 connected between the first end 21 and the second end 22. The first end 21 is electrically connected to the first outer wiring layer 11. The second end 22 is exposed from the first insulating layer 30. A remaining portion of the second insulating layer 140, after forming the receiving grooves 40, surrounds and covers the sidewalls 23 of all the first conductive post 20 to form a first insulating layer 30.

In at least one embodiment, a width of each first conductive post 20 increases from the first end 21 to the second end 22.

Figure 6:
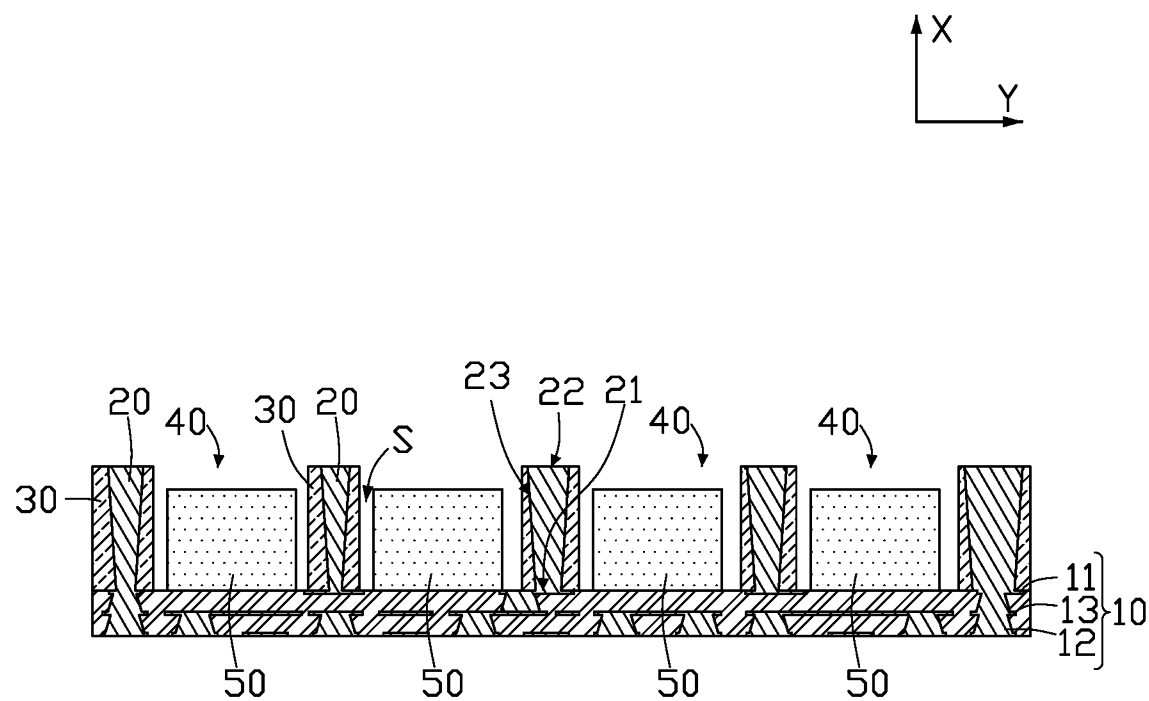
FIG. 6 is a cross-sectional view of an embedded component placed in the receiving groove of FIG. 5.

At step S6, referring to FIG. 6, an embedded component 50 is placed in each receiving groove 40. A gap S is formed between each embedded component 50 and the corresponding receiving groove 40.

Figure 7:
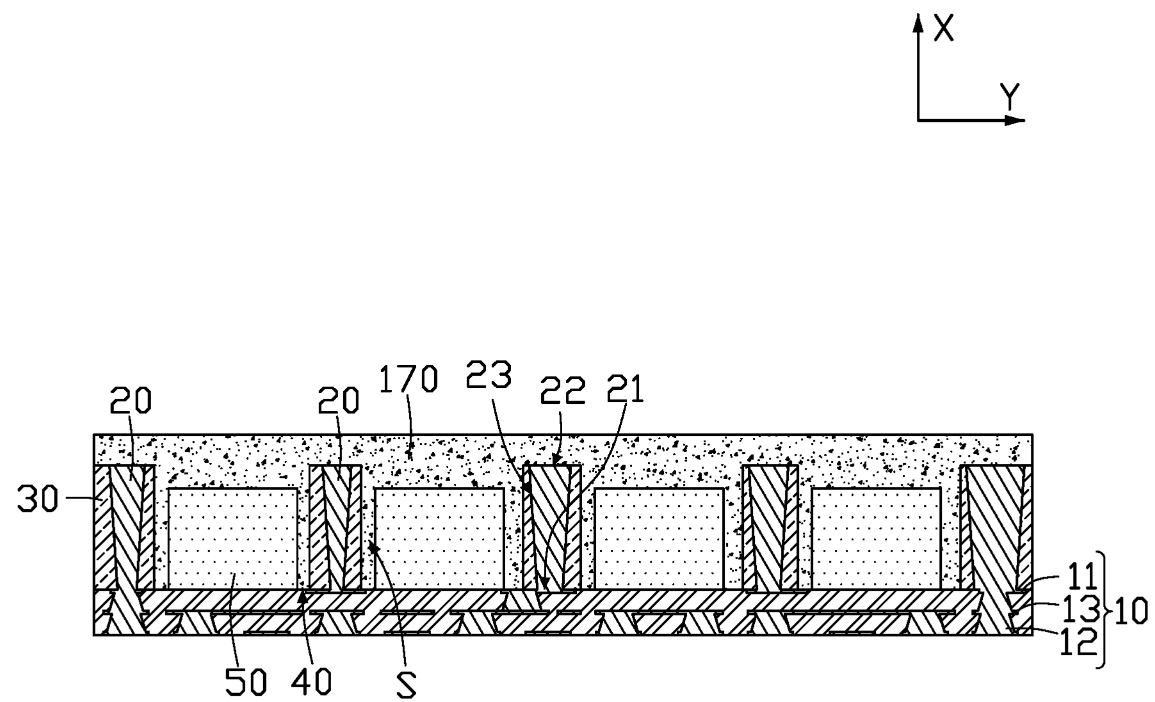
FIG. 7 is a cross-sectional view showing an insulating adhesive in the receiving groove and on the first conductive post of FIG. 6.

At step S7, referring to FIG. 7, an insulating adhesive covers the first insulating layer 30 containing the first conductive posts 20. The insulating adhesive is also forced into the gap S between each embedded component 50 and the receiving groove 40 by pressing.

Figure 8:
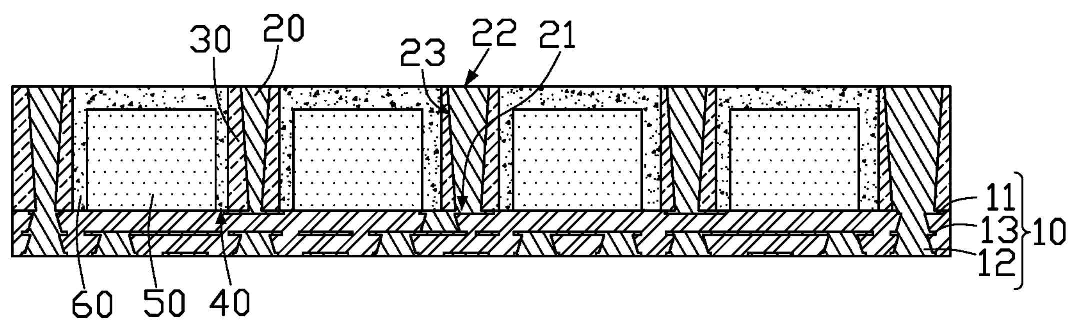
FIG. 8 is a cross-sectional view showing a portion of the insulating adhesive of FIG. 7 removed to form an insulating adhesive layer.

At step S8, referring to FIG. 8, the insulating adhesive is cured, and a portion of the insulating adhesive is removed to expose the second end 22. Thereby, a remaining portion of the insulating adhesive in the receiving groove 40 forms an insulating adhesive layer 60. The insulating adhesive layer 60 is flush with the second end 22. The insulating adhesive layer 60 fixes the embedded component 50 in the receiving groove 40.

In at least one embodiment, the insulating adhesive may be removed by grinding. The insulating adhesive includes, but is not limited to, epoxy adhesive.

In another embodiment, steps S7 and S8 may be omitted. That is, the insulating adhesive may be directly filled in the receiving groove 40 and then cured to form the insulating adhesive layer 60.

Figure 9:
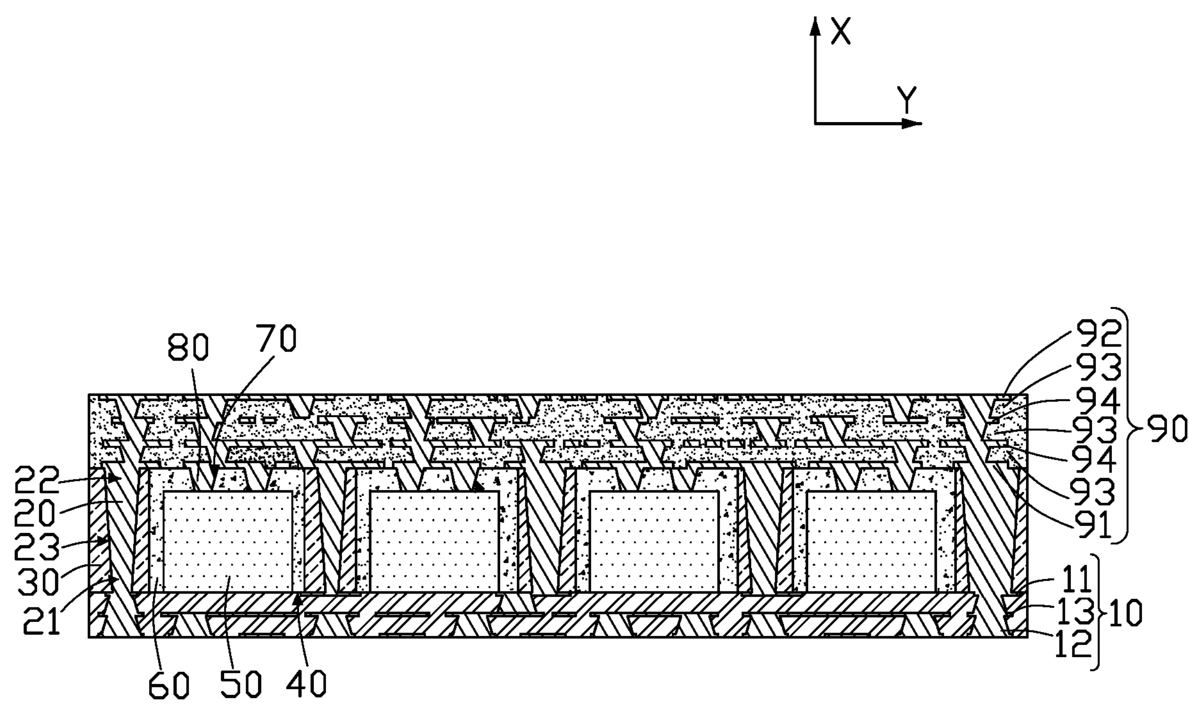
FIG. 9 is a cross-sectional view showing a second carrier plate formed on the insulating adhesive layer of FIG. 8.

At step S9, referring to FIG. 9, a second carrier plate 90 is formed on the first insulating layer 30 including the first conductive posts 20. The second carrier plate 90 further covers the insulating adhesive layer 60 and the embedded electronic component 50 in each receiving groove 40. The second carrier plate 90 includes a third outer wiring layer 91 and a fourth outer wiring layer 92 stacked in the first direction X. The third outer wiring layer 91 is electrically connected to the second end 22 of each first conductive post 20.

In at least one embodiment, the second carrier plate 90 can be manufactured after defining at least one first opening 70 in the insulating adhesive layer 60. Each first opening 70 extends along the first direction X, and the pins of each embedded electronic component 50 are exposed from at least one first opening 70. A metal layer (not shown) is then formed in each first opening 70 and on the insulating adhesive layer 60 and the first insulating layer 30 including the first conductive posts 20 by an electroplating process. The metal layer in each first opening 70 forms a second conductive post 80, which is electrically connected to the corresponding embedded component 50. The metal layer on the insulating adhesive layer 60 and the first insulating layer 30 including the first conductive posts 20 are then etched to form the third outer wiring layer 91, and the third outer wiring layer 91 is connected to each embedded component 50 through the corresponding second conductive post 80. Then, a first substrate layer 93 and a second metal foil (not shown) are pressed on the third outer wiring layer 91. The first substrate layer 93 is sandwiched between the second metal foil and the third outer wiring layer 91. The second metal foil is etched to form the fourth outer wiring layer 92.

In at least one embodiment, the second carrier plate 90 may further include at least one second intermediate wiring layer 94 between the third outer wiring layer 91 and the fourth outer wiring layer 92. The at least one second intermediate wiring layer 94 is electrically connected to the third outer wiring layer 91 and the fourth outer wiring layer 92. In the second direction Y, a line width of the first outer wiring layer 11 and the second outer wiring layer 12 is greater than that of the third outer wiring layer 91 and the fourth outer wiring layer 92. In at least one embodiment, in the second direction Y, a line width of the first intermediate wiring layer 13 is greater than that of the second intermediate wiring layer 94.

Figure 10:
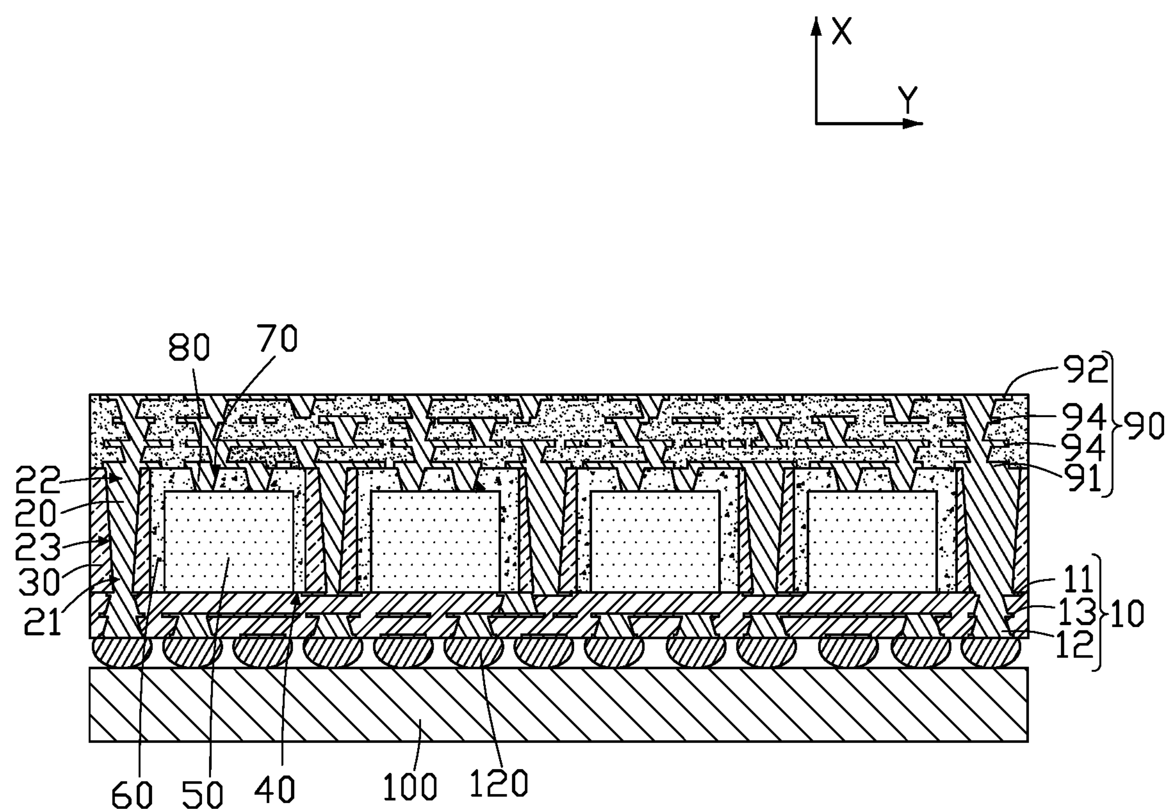
FIG. 10 is a cross-sectional view showing a first outer component formed on a second outer wiring layer of the second carrier plate of FIG. 9.
Figure 11:
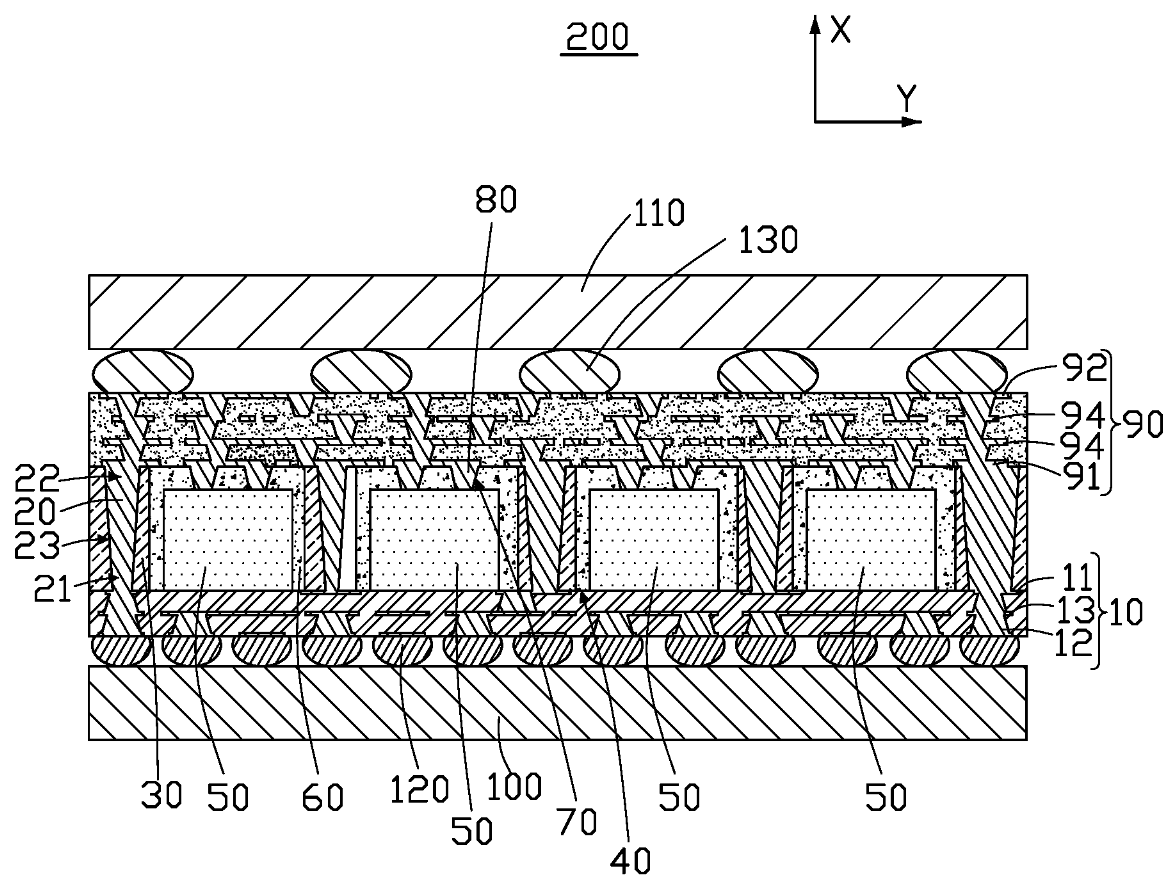
FIG. 11 is a cross-sectional view showing a second outer component formed on a fourth outer wiring layer of the second carrier plate of FIG. 10.

At step S10, referring to FIGS. 10 and 11, a first outer component 100 and a second outer component 110 are provided. The first outer component 100 is formed on and electrically connected to the second outer wiring layer 12 by a reflow soldering process. The second outer component 110 is formed on and electrically connected to the fourth outer wiring layer 92 also by the reflow soldering process. Thereby, the packaging structure 200 is obtained.

The reflow soldering process can generate at least one first solder ball 120 that electrically connects the first outer component 100 to the second outer wiring layer 12, and at least one second solder ball 130 that electrically connects the second outer component 110 to the fourth outer wiring layer 92.

Therefore, only two reflow soldering processes are needed to manufacture the packaging structure 200. Likelihood of the packaging structure 200 cracking, that may be caused by the reflow soldering process, are reduced, and quality of the packaging structure 200 is improved. In addition, a high-strength bonding is made between the first conductive posts 20 and the first outer wiring layer 11, which improves the reliability of the packaging structure 200.

Referring to FIG. 11, an embodiment of a packaging structure 200 is also provided according to the present disclosure. The packaging structure 200 includes a first carrier plate 10. The first carrier plate 10 includes a first outer wiring layer 11 and a second outer wiring layer 12 stacked in the first direction X. The first outer wiring layer 11 and the second outer wiring layer 12 are electrically connected to each other. At least two first conductive posts 20 are formed on the first outer wiring layer 11, and the first conductive posts 20 are arranged along the second direction Y perpendicular to the first direction X. Each of the first conductive posts 20 includes a first end 21, a second end 22 opposite to the first end 21, and a sidewall 23 connected between the first end 21 and the second end 22. The first end 21 is electrically connected to the first outer wiring layer 11. A first insulating layer 30 surrounds the sidewalls 23 of all the first conductive posts 20, and the second end 22 is exposed from the first insulating layer 30. A receiving groove 40 is defined between adjacent first conductive posts 20. An embedded component 50 is disposed in each receiving groove 40. The embedded component 50 is connected and fixed to the first insulating layer 30 through an insulating adhesive layer 60.

The packaging structure 200 further includes a second carrier plate 90. The second carrier plate 90 includes a third outer wiring layer 91 and a fourth outer wiring layer 92 stacked in the first direction X. The third outer wiring layer 91 is electrically connected to the second end 22 and the fourth outer wiring layer 92. The second carrier plate 90 further includes at least one second conductive post 80, which passes through the insulating adhesive layer 60 along the first direction X and electrically connects the third outer wiring layer 91 to the embedded component 50.

The packaging structure 200 further includes a first outer component 100, a second outer component 110, at least one first solder ball 120, and at least one second solder ball 130. The first solder ball 120 electrically connects the first outer component 100 to the second outer wiring layer 12. The second solder ball 130 electrically connects the fourth outer wiring layer 92 to the second outer component 110. In at least one embodiment, the embedded component 50 may be a chip, and each of the first outer component 100 and the second outer component 110 may be a main board or a memory chip.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a packaging structure, comprising:

providing a first carrier plate, wherein the first carrier plate comprises a first outer wiring layer and a second outer wiring layer stacked in a first direction, the first outer wiring layer is electrically connected to the second outer wiring layer; forming two first conductive posts on the first outer wiring layer, the two first conductive posts arranged along a second direction perpendicular to the first direction, wherein each of the two first conductive posts comprises a first end electrically connected to the first outer wiring layer, a second end opposite to the first end, and a sidewall connected between the first end and the second end, a first insulating layer surrounds the sidewall of each of the two first conductive posts, the second end of each of the two first conductive posts is exposed from the first insulating layer, and a receiving groove is formed between the two first conductive posts; placing an embedded component in the receiving groove;

forming a second carrier plate on the first insulating layer containing the first conductive posts, wherein the second carrier plate comprises a third outer wiring layer and a fourth outer wiring layer stacked in the first direction, the third outer wiring layer is electrically connected to the second end of each of the two first conductive posts and the embedded component, and the fourth outer wiring layer is electrically connected to the third outer wiring layer; and electrically connecting a first outer component to the second outer wiring layer through a reflow soldering process, and electrically connecting a second outer component to the fourth outer wiring layer through another reflow soldering process, thereby obtaining the packaging structure, wherein after placing the embedded component in the receiving groove, the method further comprises: forming an insulating adhesive layer in a gap between the embedded component and the receiving groove, wherein forming the second carrier plate comprises: defining a first opening in the insulating adhesive layer; forming a second conductive post in the first opening, wherein the second conductive post is electrically connected to the embedded component; forming the third outer wiring layer on the insulating adhesive layer; and forming the fourth outer wiring layer on the third outer wiring layer, and wherein the insulating adhesive layer is flush with the second end of each of the two first conductive posts.

2. The method according to claim 1, wherein placing the embedded component in the receiving groove and filling the insulating adhesive layer in the gap further comprises: covering a second insulating layer on the first outer wiring layer; defining two second openings in the second insulating layer, wherein each of the two second openings extends along the first direction to expose a portion of the first outer wiring layer; forming the two first conductive posts in the two second openings;

and defining the receiving groove in the second insulating layer and between the two first conductive posts, wherein the receiving groove and each of the two first conductive posts are spaced from each other in the second direction.

3. The method according to claim 1, wherein forming the insulating adhesive layer comprises: covering an insulating adhesive on the first insulating layer containing the two first conductive posts, and pressing the insulating adhesive into the gap; curing the insulating adhesive; and removing a portion of the cured insulating adhesive to expose the second end of each of the two first conductive posts, and a remaining portion of the insulating adhesive in the gap forms the insulating adhesive layer.

4. The method according to claim 3, wherein the insulating adhesive is removed by grinding.

5. The method according to claim 1, wherein forming the insulating adhesive layer comprises: directly filling an insulating adhesive in the gap;

and curing the insulating adhesive to form the insulating adhesive layer.

6. The method according to claim 1, wherein forming the third outer wiring layer and the fourth outer wiring layer comprises: electroplating a metal layer in the first opening and on the insulating adhesive layer and the first insulating layer containing the two first conductive posts; etching the metal layer on the insulating adhesive layer and the first insulating layer to the third outer wiring layer, wherein the metal layer in the first opening forms the second conductive post; forming a first substrate layer and a metal foil on the third outer wiring layer; and etching the metal foil to the fourth outer wiring layer.

7. The method according to claim 2, wherein the second opening is formed by laser.

8. A packaging structure, comprising: a first carrier plate comprising a first outer wiring layer and a second outer wiring layer stacked in a first direction, and the first outer wiring layer and the second outer wiring layer are electrically connected to each other; two first conductive posts formed on the first outer wiring layer, the at least two first conductive posts arranged along a second direction perpendicular to the first direction, wherein each of the two first conductive posts comprises a first end electrically connected to the first outer wiring layer, a second end opposite to the first end, and a sidewall connected between the first end and the second end; a first insulating layer surrounding the sidewall of each of the two first conductive posts, wherein the second end of each of the two first conductive posts is exposed from the first insulating layer, a receiving groove is formed between the two first conductive posts; an embedded component placed in the receiving groove; a second carrier plate formed on the first insulating layer containing the first conductive posts, wherein the second carrier plate comprises a third outer wiring layer and a fourth outer wiring layer stacked in the first direction, the third outer wiring layer is electrically connected to the second end and the fourth outer wiring layer, the second carrier plate further comprises a second conductive post, the second conductive post electrically connects the third outer wiring layer to the embedded component; a first outer component electrically connected to the second outer wiring layer through a first solder ball; and a second outer component electrically connected to the fourth outer wiring layer through a second solder ball; an insulating adhesive layer filled in a gap between the embedded component and the receiving groove, wherein the second conductive post passes through the insulating adhesive layer along the first direction; and wherein the insulating adhesive layer is flush with the second end of each of the two first conductive posts.

9. The packaging structure according to claim 8, wherein the insulating adhesive layer defines a first opening along the first direction, a second conductive post is disposed in the first opening, and electrically connects the third outer wiring layer to the embedded component.

10. The packaging structure according to claim 8, wherein a width of each of the two first conductive posts increases from the first end to the second end.

11. The packaging structure according to claim 8, wherein the first carrier plate further comprises a first intermediate wiring layer between the first outer wiring layer and the second outer wiring layer, and the first intermediate wiring layer is electrically connected to the first outer wiring layer and the second outer wiring layer.

12. The packaging structure according to claim 8, wherein the second carrier plate further comprises a second intermediate wiring layer between the third outer wiring layer and the fourth outer wiring layer, and the second intermediate wiring layer is electrically connected to the third outer wiring layer and the fourth outer wiring layer.

13. The packaging structure according to claim 8, wherein in the second direction, a line width of the first outer wiring layer and the second outer wiring layer is greater than that of the third outer wiring layer and the fourth outer wiring layer.

* * * * *